United States Patent [19]

Kako et al.

[11] Patent Number: 5,504,283

[45] Date of Patent: *Apr. 2, 1996

[54] KEY SWITCH DEVICE

[75] Inventors: Mitsumasa Kako, Tokai; Takeyuki Takagi, Nagoya; Isao Mochizuki, Gifu, all of Japan

[73] Assignee: Brother Kogyo Kabushiki Kaisha, Nagoya, Japan

[*] Notice: The term of this patent shall not extend beyond the expiration date of Pat. No. 5,278,371.

[21] Appl. No.: 172,199

[22] Filed: Dec. 23, 1993

Related U.S. Application Data

[63] Continuation-in-part of Ser. No. 967,070, Oct. 28, 1992, Pat. No. 5,278,371.

[30] Foreign Application Priority Data

Apr. 5, 1993 [JP] Japan ............... 5-016680 U

[51] Int. Cl.$^6$ ............... H01H 3/12
[52] U.S. Cl. ............... 200/5 A; 200/344; 200/517
[58] Field of Search ............... 200/4, 5 A, 17, 200/16 R, 512, 517, 18, 329, 332, 335, 336, 337, 341, 344, 345

[56] References Cited

U.S. PATENT DOCUMENTS

| | | | |
|---|---|---|---|
| 2,550,250 | 4/1951 | Huppert | 200/159 |
| 3,174,685 | 3/1965 | Swanson | 235/54 |
| 3,849,611 | 11/1974 | Walker, Jr. | 200/5 A |
| 4,433,225 | 2/1984 | Cowles | 200/340 |
| 4,560,844 | 12/1985 | Takamura et al. | 200/5 A |
| 4,560,845 | 12/1985 | Takamura et al. | 200/5 A |
| 4,580,022 | 4/1986 | Oelsch et al. | 200/340 |
| 4,735,520 | 4/1988 | Suzuki et al. | 400/488 |
| 4,902,862 | 2/1990 | Oelsch et al. | 200/344 |
| 4,922,070 | 5/1990 | Dorinski | 200/512 |
| 4,950,093 | 8/1990 | Ertl | 400/496 |
| 5,278,371 | 1/1994 | Watanabe et al. | 200/344 |
| 5,278,372 | 1/1994 | Takagi et al. | 200/344 |
| 5,280,147 | 1/1994 | Mochizuki et al. | 200/344 |

FOREIGN PATENT DOCUMENTS

| | | | |
|---|---|---|---|
| 0490023 | 6/1992 | European Pat. Off. | H01H 3/12 |
| 0543649 | 5/1993 | European Pat. Off. | H01H 13/14 |
| 4-51388 | 12/1992 | Japan | H01H 13/14 |
| 5225858 | 3/1993 | Japan | H01H 13/20 |
| 2239349 | 6/1991 | United Kingdom | H01H 13/70 |

*Primary Examiner*—Kristine L. Kincaid
*Assistant Examiner*—Michael A. Friedhofer
*Attorney, Agent, or Firm*—Oliff & Berridge

[57] ABSTRACT

A conductor pattern surface of a plastically deformable substrate of a key switch device is insulated with a resist, and a switching circuit pattern is printed on the resist layer by using conductive ink. Carbon conductor ink is applied by printing on connectors and fixed contact patterns, and a mask is printed on the other portion. Mounting portions for mounting a guide supporting member are formed on the substrate by pressing the substrate from the lower surface thereof. An object of the invention is to integrate an electrical circuit pattern with a mounting portion of actuator structure so as to provide a key switch device which can reduce the thickness and the number of parts of a keyboard for a word processor, personal computer or any other device having a keyboard or keypad.

21 Claims, 6 Drawing Sheets

KEY SWITCH DEVICE

This application is a continuation in part of U.S. patent application Ser. No. 07/967,070 filed Oct. 28, 1992 and issued as U.S. Pat. No. 5,278,371 on Jan. 11, 1994.

BACKGROUND OF THE INVENTION

1. Field of the Invention

The invention relates to a key switch device and, more particularly, to a key switch device suitably used in a thin keyboard associated with a notebook-size word processor, notebook-size personal computer, etc.

2. Description of the Related Art

In general, a conventional key switch device has a structure such that a circuit board in the form of an insulated film is sandwiched between a holder member and a switch supporting plate as described in Japanese Patent Application No. Hei 3-330160 (corresponding to U.S. Pat. Nos. 5,280,147 and 5,278,372.

On the film circuit board are printed two kinds of switching circuits and a plurality of fixed contact patterns each consisting of two fixed contacts extending from the two kinds of switching circuits and combined in a comb-shaped manner. An inverted cup-shaped rubber spring is located at a position corresponding to each fixed contact pattern. A movable contact is provided in the rubber spring and, when the rubber spring is depressed, a switching operation is effected.

An actuator is provided in the holder member over the rubber spring, and a key top is mounted on the upper end of the actuator. When the key top is depressed by an operator, it is guided by the actuator to the upper portion of the rubber spring, and the rubber spring is depressed by the actuator. When an amount of depression of the rubber spring exceeds a certain limit, the movable contact in the rubber spring comes into contact with the fixed contact pattern, thereby short-circuiting the two fixed contacts and effecting the switching operation.

The switch supporting plate corresponds to a lower cover of a keyboard device and serves to enhance the rigidity of the keyboard device and improve the reliability of key entry.

Recent word processors, personal computers, etc. have been reduced in size, especially in thickness, weight, and cost. In association with this trend, a keyboard associated with such equipment is required to be reduced in size, thickness, and weight.

On the other hand, a movable portion of any key of the keyboard is required to have a good operability in view of human engineering (it is generally known that a minimum key stroke of 3 to 4 mm is required for an operator to recognize depression of the key). Accordingly, the above requirement must be satisfied with the minimum key stroke maintained.

In most cases, however, peripheral parts of the actuator and the holder member are formed mainly of a resin material by injection molding. Accordingly, a minimum wall thickness of 1.5 mm in each member is necessary. This connotes that the greater the number of parts to be laminated, the more difficult the reduction in thickness and, of course, the higher the weight.

Further, the conventional key switch device has three-layer structure consisting of the holder member, the film circuit board, and the switch supporting plate. Unless these three layers are laminated uniformly and closely, the reliability of response to key entry is deteriorated. As countermeasures against such a problem, it is known to suppress separation of these three layers at every key or at given intervals. However, much trouble is taken to ensure the suppression.

It is accordingly an object of the invention to provide a key switch device having an integrated structure of a substrate, an electrical circuit pattern, and a mounting portion for mounting a guide supporting member, which can reduce the number of parts, simplify the construction, reduce the size, especially the thickness of the keyboard, ensure a sufficient key stroke, and obtain good key operability and reliable key entry.

SUMMARY OF THE INVENTION

According to the invention, there is provided a key switch device comprising a substrate formed of a plastically deformable metal material; a circuit pattern printed on an insulated upper surface of the substrate; a fixed contact pattern printed on the insulated upper surface of the substrate and having at least a pair of fixed contacts formed in the circuit pattern; a key top provided in a relationship corresponding to the fixed contact pattern; a guide supporting member connected to a lower portion of the key top for supporting the key top and guiding vertical movement of the key top; a movable contact for performing a switching operation between the fixed contacts in association with the vertical movement of the key top; and a mounting portion for mounting the guide supporting member, the mounting portion being formed integrally with the substrate.

Preferably, the key top has a connecting portion adapted to be connected to the guide supporting member, the connecting portion projecting from a lower surface of the key top at a position corresponding to the mounting portion of the substrate; the guide supporting member comprising two link members intersecting each other and mutually rotatably connected at a point of intersection, each of the two link members having opposite ends provided with support pins; the mounting portion of the substrate comprising a first group located on one side with respect to a vertical line passing the point of intersection and a second group located on the other side with respect to the vertical line; the connecting portion of the key top comprising a first group located on one side with respect to the vertical line and a second group located on the other side with respect to the vertical line; the first group of the mounting portion and the connecting portion have holes for rotatably supporting the support pins of the two link members on one side; and the second group of the mounting portion and the connecting portion have grooves for slidably supporting the support pins of the two link members on the other side.

More preferably, the mounting portion is formed by pressing the substrate from a lower surface thereof, and a raised surface is formed on the upper surface of the substrate at a portion with which the support pins of the guide supporting member are in contact.

In operation, when the key top is depressed, the guide supporting member connected to the lower portion of the key top downwardly guides the key top. When the key top is further depressed, the movable contact is lowered by the guide supporting member to come into contact with the fixed contact pattern printed on the substrate, thus effecting the switching operation.

As described above, the invention can exhibit the following effects by integrating the substrate, the electrical circuit patterns, and the mounting portion for mounting the guide supporting member. That is, the number of parts can be reduced; the construction can be simplified; the keyboard can be reduced in size, especially in thickness; a sufficient key stroke can be ensured; and good key operability and reliable key entry can be obtained.

Further, the blanked holes resulting from the formation of the mounting portions of the substrate function as cooling holes to thereby effect radiation.

DESCRIPTION OF THE PREFERRED EMBODIMENT

There will now be described in detail a preferred embodiment according to the invention with reference to the drawings.

The construction of a key switch device in the preferred embodiment will be first described with reference to FIGS. 1 through 7.

The key switch device is generally constructed of a substrate 1, a rubber spring 4, a key top 5, and a guide supporting member 6.

Figure 4:
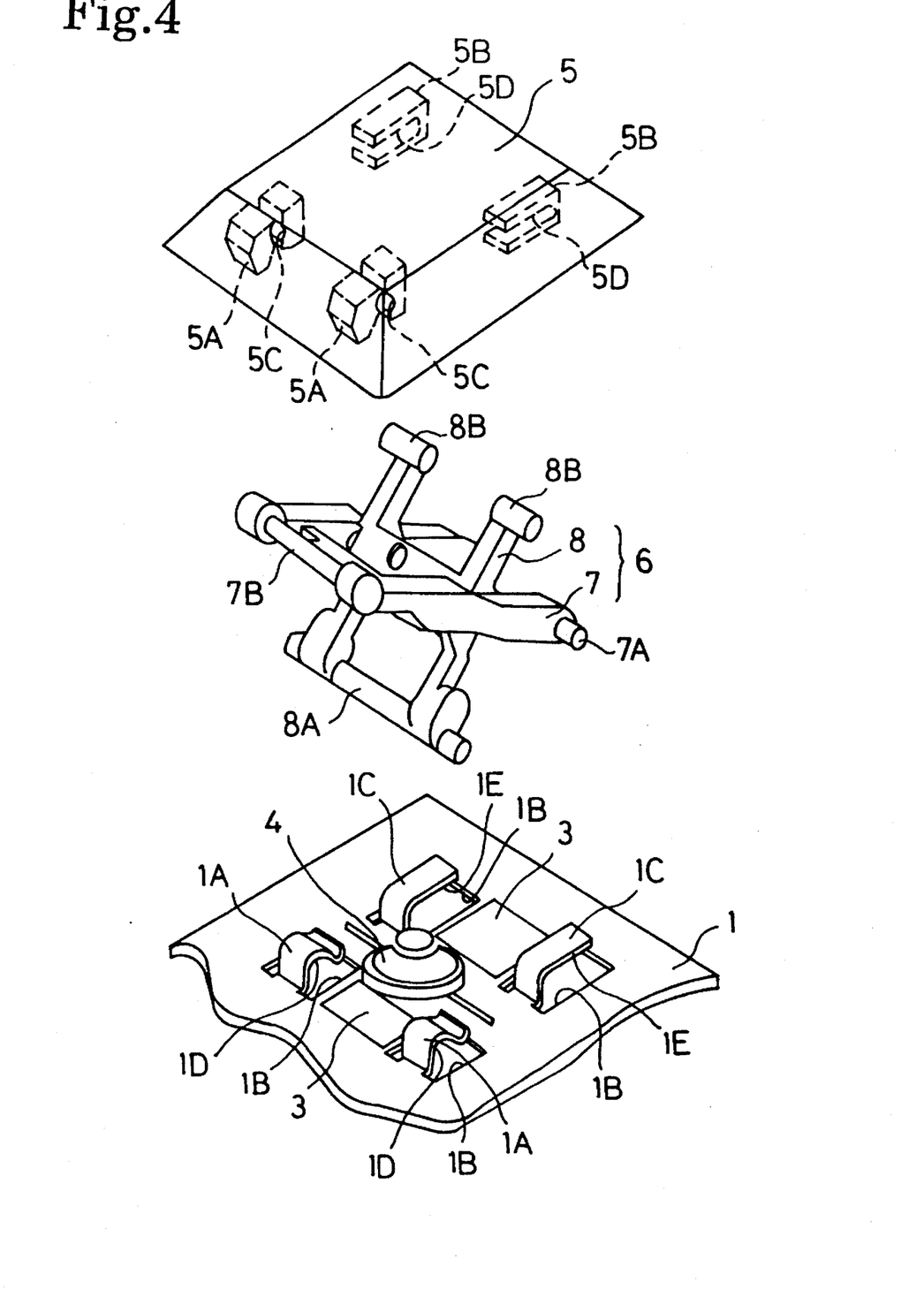
FIG. 4 is an exploded perspective view of the key switch device in the preferred embodiment.

The key top 5 is formed of a synthetic resin, such as an ABS resin, and a character, such as an alphabetical letter, is formed on the upper surface of the key top 5 by printing or the like. As shown in FIG. 4, the lower surface of the key top 5 is provided integrally with two pairs of connecting portions 5A and 5B projecting downward.

Each connecting portion 5A is provided with an arcuate recess 5C for rotatably supporting a support shaft 7B formed at one end of a first link member 7, to be hereinafter described. The arcuate recess 5C opens at a lower end thereof, and the support shaft 7B, at one end of a first link member 7, is accordingly received from the lower opening end of the arcuate recess 5C.

Each connecting portion 5B is provided with an elongated recess 5D for horizontally slidably supporting a support pin 8B formed at one end of a second link member 8, to be hereinafter described. The elongated recess 5D opens at a longitudinal end thereof and the support pin 8B is received from the longitudinal opening end of the elongated recess 5D.

The guide supporting member 6, for vertically movably supporting the key top 5 and guiding the vertical movement thereof, is disposed under the key top 5. The guide supporting member 6 is constructed of the first link member 7 and the second link member 8. Both the first and second link members 7,8 are also formed of a synthetic resin, such as an ABS resin.

Figure 3:
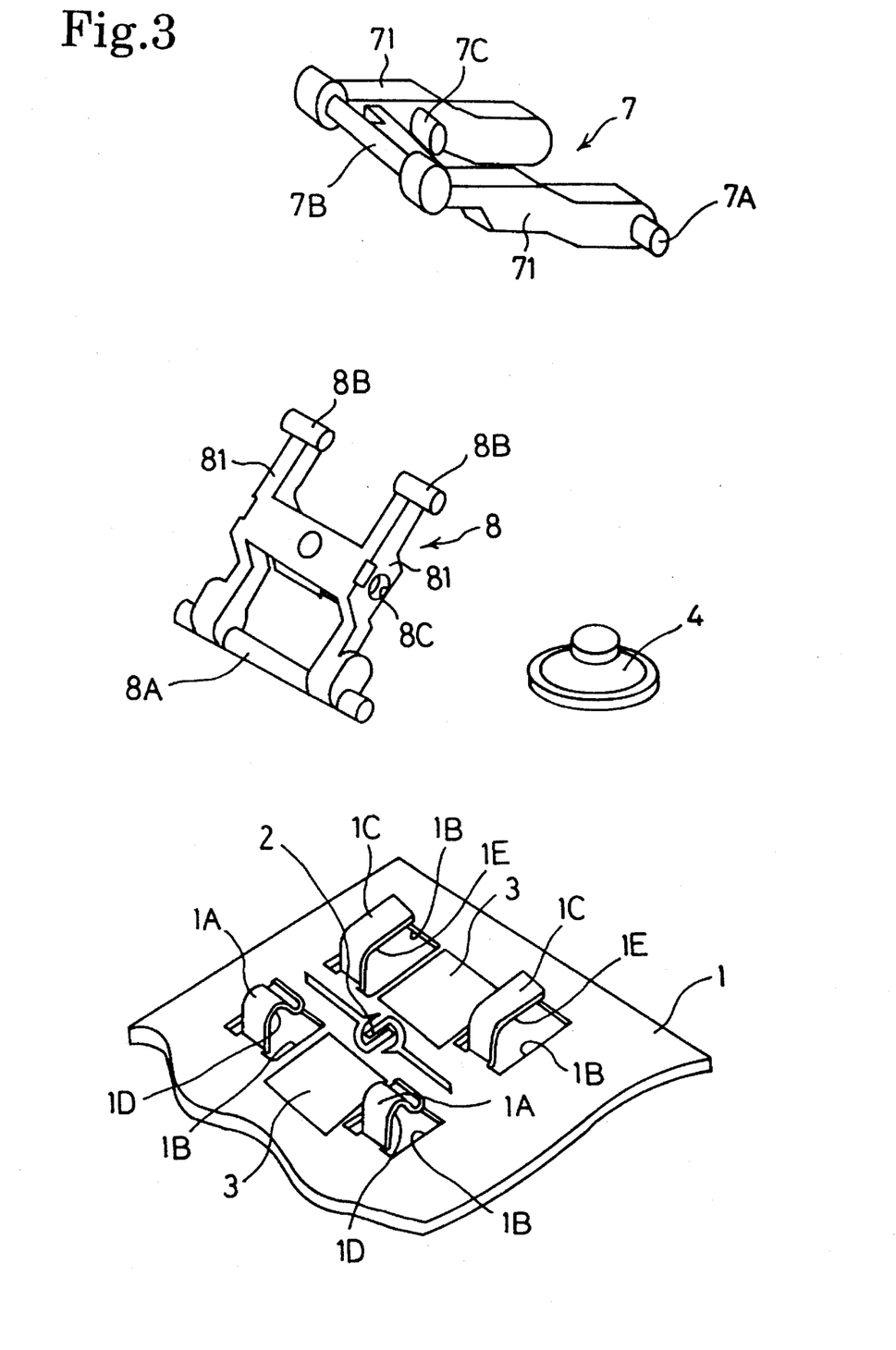
FIG. 3 is an exploded perspective view of the substrate and associated components in the preferred embodiment.
Figure 5:
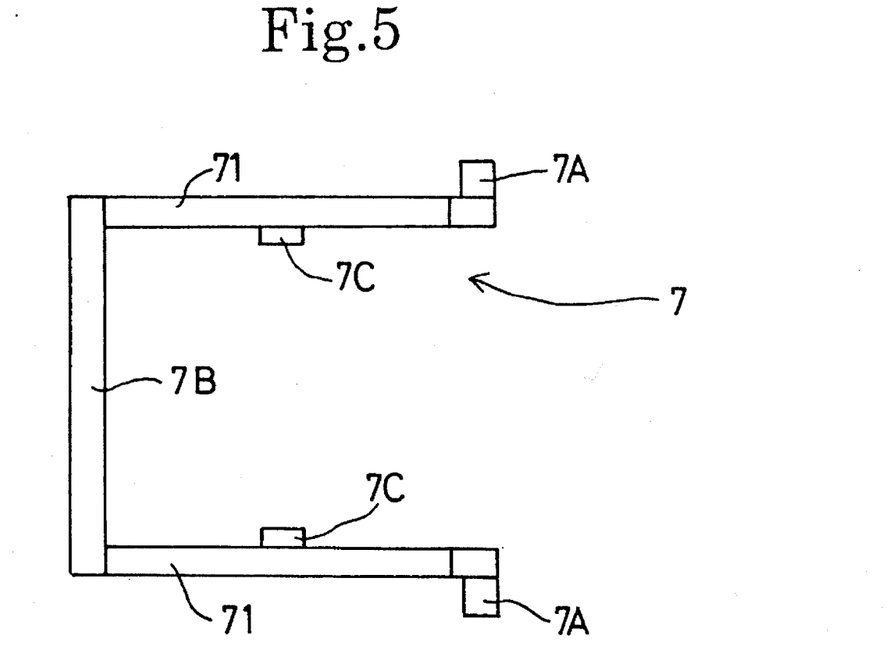
FIG. 5 is a plan view of a first link member in the preferred embodiment.

As shown in FIGS. 3 and 5, the first link member 7 is formed in a U-shaped configuration as viewed in plan. The first link member 7 is integrally constructed of a pair of opposed side plates 71, a support shaft 7B extending between the side plates 71 at one end thereof, and a pair of support pins 7A projecting outward from the side plates 71 at the other end thereof. The support shaft 7B is received and rotatably supported in the arcuate recesses 5C of the two connecting portions 5A of the key top 5. The two support pins 7A are slidably supported to two mounting portions 1C of the substrate 1, to be hereinafter described, respectively. The inside surface of each side plate 71 is formed at its central portion with a connecting pin 7C projecting inward. The connecting pins 7C are rotatably supported in connecting holes 8C formed in the second link member 8 to be hereinafter described. As viewed in side elevation, the distance from the connecting pins 7C to the support pins 7A is equal to the distance from the connecting pins 7C to the support shaft 7B.

Figure 6:
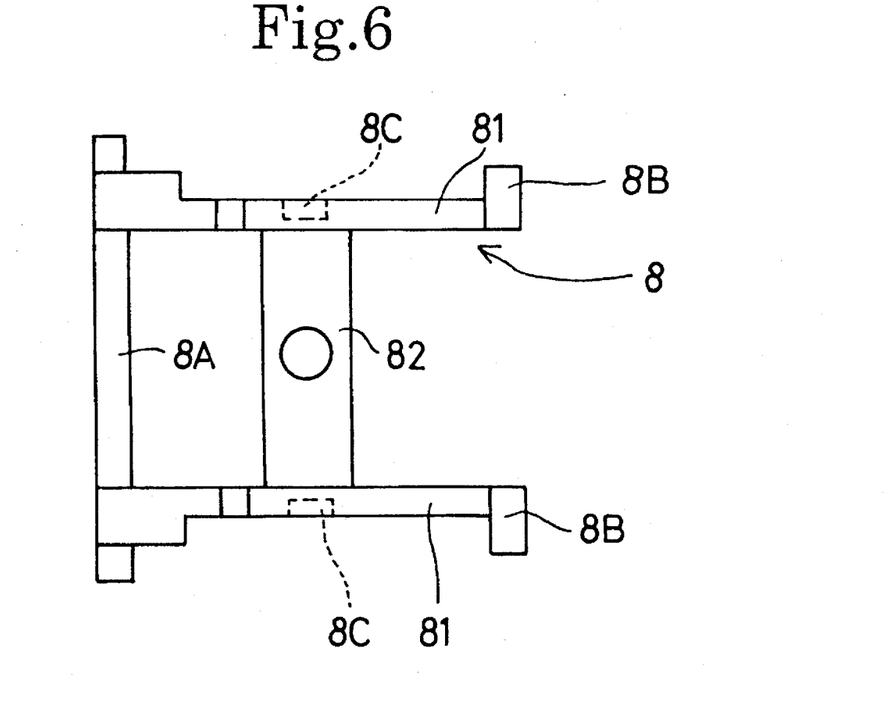
FIG. 6 is a plan view of a second link member in the preferred embodiment.

As shown in FIGS. 3 and 6, the second link member 8 is integrally constructed of a pair of opposed side plates 81, a support shaft 8A at one end thereof extending between and projecting outward from the side plates 81 and a pair of support pins 8B projecting outward from the side plates 81 at the other end thereof. The support shaft 8A is rotatably supported at both ends thereof to two mounting portions 1A of the substrate 1, to be hereinafter described. The two support pins 8B are received in the elongated recesses 5D of the two connecting portions 5B of the key top 5, respectively, and slidably supported in the elongated recesses 5D. The outside surface of each side plate 81 is formed at its central portion with a connecting hole 8C for rotatably supporting a corresponding one of the connecting pins 7C of the side plates 71 of the first link member 7. Accordingly, the first and second link members 7,8 are rotatably connected together through the connecting pins 7C and the connecting holes 8C in such a manner as to intersect each other in an X-shaped configuration as shown in FIG. 7.

Figure 7:
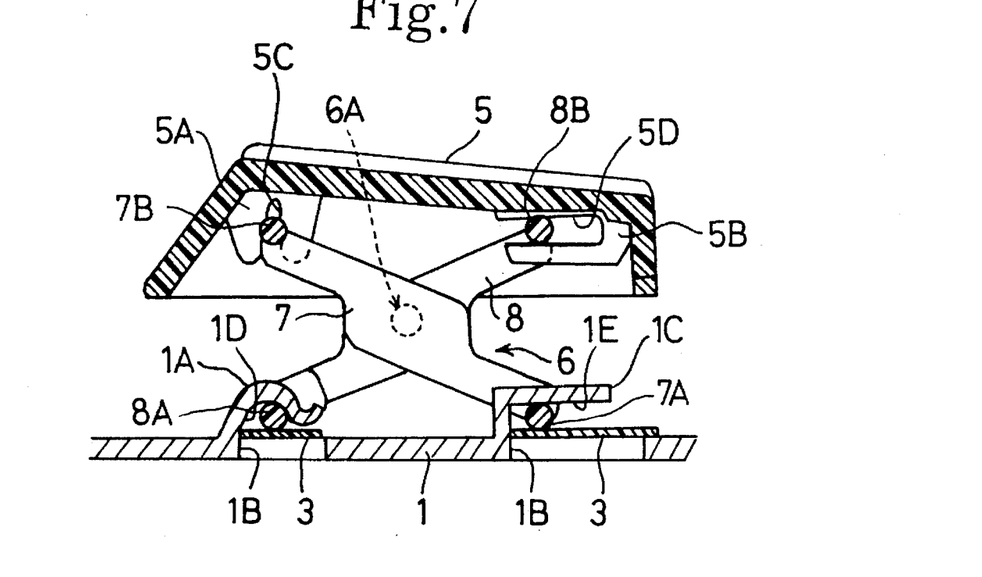
FIG. 7 is a vertical sectional view of the key switch device in the preferred embodiment.
Figure 8A:
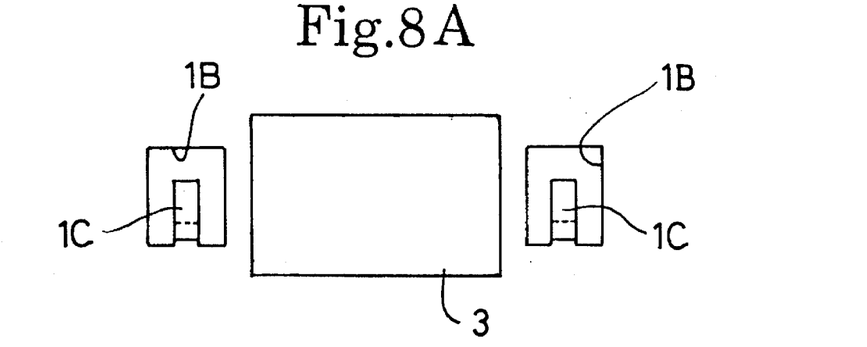
FIG. 8A is a plan view of a thick film printed on the substrate in the preferred embodiment.
Figure 8B:
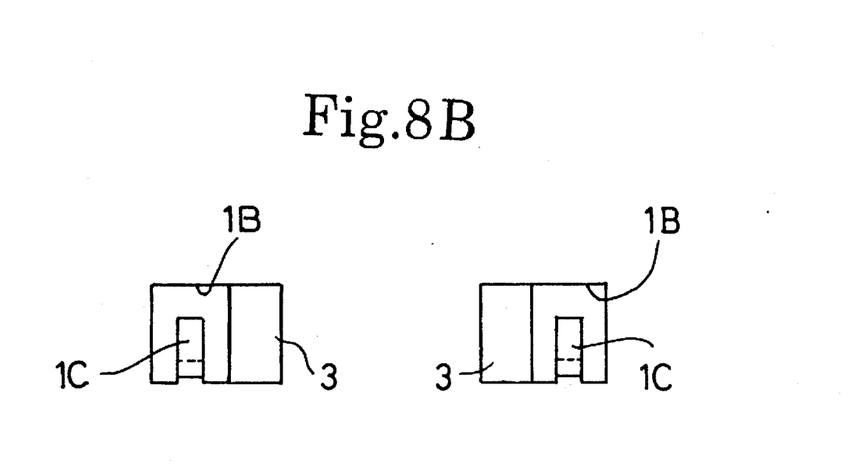
FIG. 8B is a plan view of an alternative manner of printing the thick film on the substrate.

Referring to FIG. 7, reference numeral 6A denotes a fulcrum portion consisting of the connecting pins 7C of the first link member 7 and the connecting holes 8C of the second link member 8. As viewed in side elevation, the distance from the connecting holes 8C to the support pins 8B is equal to the distance from the connecting holes 8C to the support shaft 8A. Further, a push bar 82 extends between the side plates 81 at a central portion thereof. The push bar 82 is normally disposed over the rubber spring 4 and functions to depress the rubber spring 4 when the key top 5 is depressed to mutually rotate the first and second link members 7,8. Accordingly, when the key top 5 is depressed, the rubber spring 4 is depressed by the push bar 82 to thereby effect a switching operation.

As shown in FIG. 3, each side plate 71 of the first link member 7 is reduced in width at one end portion thereof as viewed in side elevation. Similarly, each side plate 81 of the second link member 8 is reduced in width at one end portion thereof as viewed in side elevation. With this structure, the end portions of the side plates 71 and 81 of the first and second link members 7 and 8 are prevented from coming into contact with each other during the course of depression of the key top 5. Accordingly, the depression of the key top 5 is not hindered over the stroke thereof so that a sufficient key stroke can be ensured.

The substrate 1 is formed of plastically deformable metal such as iron or aluminum. The surface of the substrate 1 is electrically insulated by under-resist printing. A first electrical circuit pattern for switching is printed with a conductive coating material, such as silver, on the electrically insulated surface of the substrate 1. A portion of the first electrical circuit pattern intersecting a second electrical circuit pattern is electrically insulated by printing. Over this insulating print, the second electrical circuit pattern is similarly printed with a conductive coating material. A plurality of hook-shaped fixed contacts extend from the two circuit patterns at fixed intervals, and each pair of the fixed contacts extending from the two circuit patterns are combined to form a fixed contact pattern 2.

The fixed contact patterns 2 and connectors (not shown) on the substrate 1 are covered with carbon coating, and the other portion of the printed surface of the substrate 1 is covered with resist printing.

Figure 1:
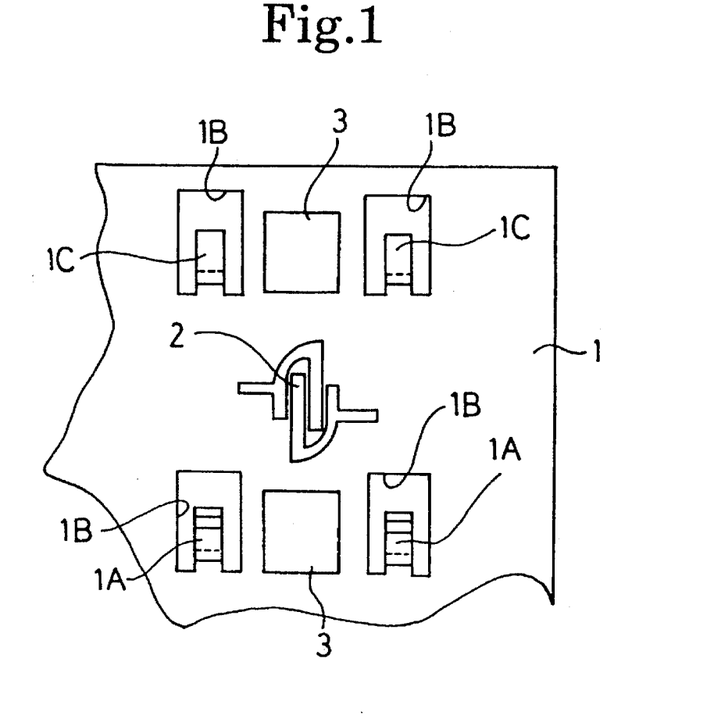
FIG. 1 is a top plan view of a substrate of a key switch device in a preferred embodiment according to the present invention.

The substrate 1 is formed integrally with a plurality of mounting portions 1A and 1C for mounting the guide supporting members 6 by pressing as will be hereinafter described. As shown in FIGS. 1 and 3, a pair of the mounting portions 1A and a pair of the mounting portions 1C are arranged at the four corners of a phantom rectangle so as to surround the fixed contact pattern 2. Each mounting portion 1A is so configured as to rotatably engage with the ends of the support shaft 8A of the guide supporting member 6 and each mounting portion 1C is so configured as to horizontally slidably engage with one of the support pins 7A of the guide supporting member 6. The mounting portion 1A is raised from the substrate 1 and bent arcuately, as viewed in side elevation, in such a manner as to form an arcuate recess 1D permitting rotation of the support shaft 8A therewithin. The mounting portion 1C is also raised from the substrate 1 and bent in an L-shape, as viewed in side elevation, in such a manner as to form an elongated recess 1E permitting horizontal sliding of the support pin 7A. The fixed contact patterns 2 are regularly arranged in the longitudinal and transverse directions of the substrate 1. In correspondence therewith, the mounting portions 1A and 1C are regularly arranged in the longitudinal and transverse directions of the substrate 1.

As shown in FIGS. 3 and 4, an inverted cup-shaped rubber spring 4, as a switching member, is disposed at a position corresponding to the fixed contact pattern 2 on the substrate 1. The rubber spring 4 includes therein a known movable contact. The upper surface of the rubber spring 4 is opposed at a central portion thereof to the push bar 82 of the guide supporting member 6. Accordingly, when a key top 5 is depressed, the fulcrum portion 6A is lowered, and the rubber spring 4 is depressed by the push bar 82. When an amount of depression of the rubber spring 4 exceeds a certain limit, the rubber spring 4 is buckled, and the fixed contact pattern 2 is short-circuited by the movable contact in the rubber spring 4.

Figure 2:
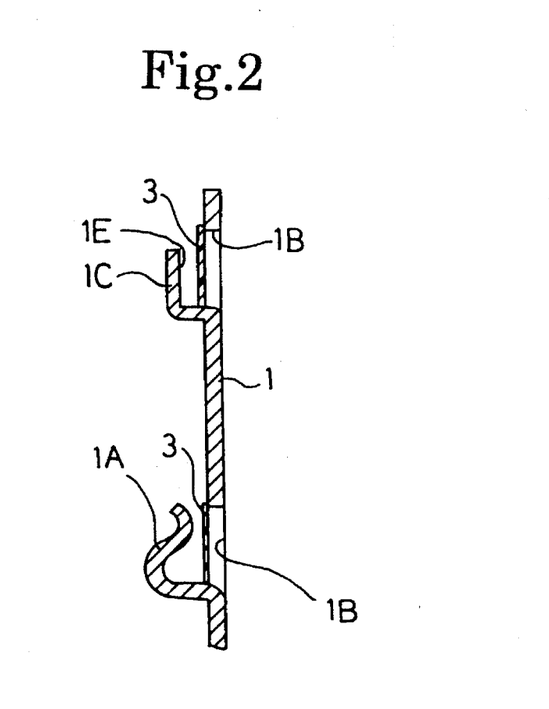
FIG. 2 is a sectional side view of the substrate shown in FIG. 1.
Figure 9:
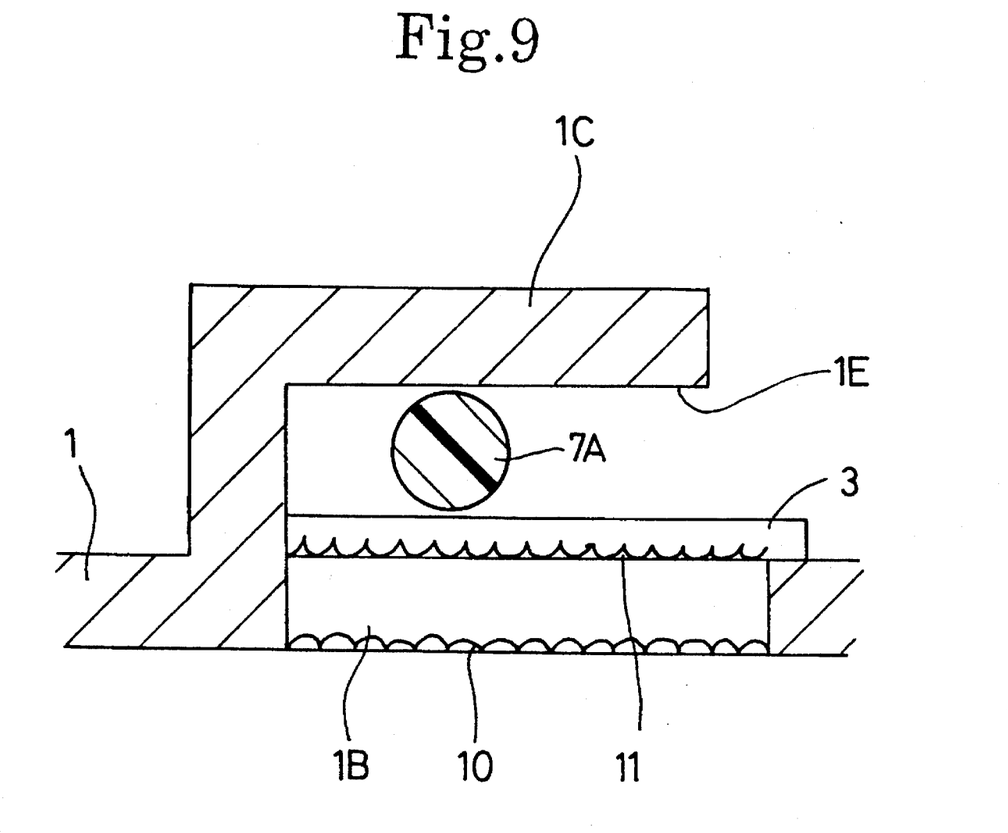
FIG. 9 is an enlarged sectional view of a slidably mounting portion and its peripheral portion on the substrate in the preferred embodiment.

As shown in FIGS. 1 and 2, thick films 3 are formed on the substrate 1. That is, the thick films 3 are formed between the two mounting portions 1A and the two mounting portions 1C of the substrate 1. Accordingly, as shown in FIG. 9, the support shaft 8A and the support pins 7A of the guide supporting member 6 are disposed on the thick films 3, so that the guide supporting member 6 is raised from the upper surface of the substrate 1 by the thickness of the thick films 3.

Now, a manufacturing method for the substrate 1 in the preferred embodiment will be described.

First, a sheet metal (solid sheet) of aluminum, iron, or other metal having similar characteristics forming the substrate 1 is prepared. The sheet metal is washed to remove any oil and stains sticking to the surface of the sheet metal. An under-resist is printed on the sheet metal, so as to electrically insulate the sheet metal. As the material of the under-resist printed on the sheet metal, an ultraviolet curing insulation screen ink such as ED452SS (the trade name by Nihon Acheson Co., Ltd.) may be used. The printing of the under-resist is effected by first applying the ultraviolet curing insulation screen ink to the surface of the washed sheet metal and then baking it in an ultraviolet light oven. The baking time and the baking temperature may be suitably modified according to the type of ink and sheet metal used. The printing of the under-resist is carried out preferably a number of times, e.g., three to four times.

Secondly, a first electrical circuit pattern for switching is printed on the insulated surface of the sheet metal by using a conductive coating material such as silver. As the material used for the first electrical circuit pattern to be printed on the insulated surface of the sheet metal, a conductive coating material such as ED6022SS (the trade name by Nihon Acheson Co., Ltd.) may be used. The printing of the first electrical circuit pattern is effected by first applying the conductive coating material to the insulated surface of the sheet metal to form a suitable pattern and then baking it in an oven. The baking time and the baking temperature may be suitably modified according to the type of conductive coating material and sheet metal used.

Thirdly, prior to printing a second electrical circuit pattern, a plurality of expected intersections between the first electrical circuit pattern and the second electrical circuit pattern are insulated with print. That is, a mask resist is selectively printed on the first electrical circuit pattern. As the material of the mask resist printed on the first electrical circuit pattern, an ultraviolet curing insulation screen ink such as ED452SS may be used. The printing of the mask resist is effected by first applying the ultraviolet curing insulation screen ink to the expected intersections between the first electrical circuit pattern and the second electrical circuit pattern and then baking it in an ultraviolet light oven. The baking time and the baking temperature may again be suitably modified according to the type of ink and sheet metal used. The printing of the mask resist is carried out preferably a number of times, e.g., three to four times.

Fourthly, the second electrical circuit pattern for switching is printed on the insulated surface of the sheet metal, that is, on the under-resist print, by using a conductive coating material such as silver. As the material of the second electrical circuit pattern to be printed, a conductive coating material such as ED6022SS may be used. The printing of the second electrical circuit pattern is effected by first applying the conductive coating material to the insulated surface of the sheet metal on which the mask resist has been formed to form a suitable pattern, and then baking it in an oven. The baking time and the baking temperature also may be suitably modified according to the type of conductive coating material and sheet metal to be used. As a result, a plurality of hook-shaped fixed contacts extend from the two circuit patterns at fixed intervals, and each pair of the fixed contacts are combined to form the fixed circuit pattern 2.

Fifthly, the fixed contact patterns 2 and connectors (not shown) on the substrate 1 are covered with a carbon coating. That is, a carbon pattern is printed on the fixed contact patterns 2 and the connectors. As the material of the carbon coating, a carbon coating material such as ED423SS (the trade name by Nihon Acheson Co., Ltd.) may be used. The printing of the carbon coating is effected by first applying the carbon coating material to the fixed contact patterns 2 and the connectors, and then baking it in an oven. The baking time and the baking temperature may be suitably modified according to the type of carbon coating material and sheet metal used.

Further, an over-resist is printed on the remaining portion of the substrate 1 other than the fixed contact patterns 2 and the connectors. As the material of the over-resist to be printed, an ultraviolet curing insulation screen ink such as ED452SS may be used. The printing of the over-resist is effected by first applying the ultraviolet curing insulation screen ink to the remaining portion of the substrate 1 other than the fixed contact patterns 2 and the connectors, and then baking it in an ultraviolet light oven. The baking time and the baking temperature may be suitably modified according to the kinds of the type of ink and sheet metal used.

The carbon pattern print and the over-resist print serve to prevent deterioration of the printed circuit due to oxidation. Further, a protective film may be attached on the over-resist printed surface of the sheet metal, so as to protect the printed circuit in plastic during further processing of the sheet metal to be carried out later.

Finally, the sheet metal on which the electrical circuit patterns and the resists have been printed is cut out. More specifically, the sheet metal is first cut out at predetermined positions to form a plurality of U-shaped blanked holes 1B and resultantly leave a plurality of hinge portions (corresponding to the mounting portions 1A and 1C). This work is called blanking. At the same time, the external shape of the substrate 1 is also formed by the blanking. Thus, as shown in FIG. 1, the U-shaped blanked holes 1B are regularly arranged in the longitudinal and transverse directions of the substrate 1. Then, the hinge portions are bent by pressing to thereby form the mounting portions 1A and 1C. In this way, the substrate 1 is completed.

In general, the blanking of a sheet metal is effected mostly by pressing from the viewpoint of cost reduction. Since the blanking by pressing employs a punch and die as a blanking die to shear and break the sheet metal, there is possibility of generation of shear droop 10 on the lower surface of the substrate 1 and burr 11 (about 100 μm in height) on the upper surface of the substrate 1 as shown in FIG. 9. In blanking the sheet metal from the lower surface thereof, the burr 11 is generated along the boundaries of the blanked holes 1B on the upper surface of the substrate 1. Accordingly, the burr 11 may hinder the support shaft 8A and the support pins 7A of the guide supporting member 6 from smoothly moving on the upper surface of the substrate 1.

To prevent such a hindrance of the burr 11, thick films 3 are formed on the upper surface of the substrate 1 between the two mounting portions 1A and between the two mounting portions 1C, that is, at suitable portions near the mounting portions 1A and 1C where the support shaft 8A and the support pins 7A come into contact as shown in FIGS. 1 to 4 and 7 to 9. The formation of the thick films 3 is effected by first applying an ultraviolet curing insulation screen ink as mentioned above to necessary portions on the substrate 1 where the thick films 3 are to be formed, and then baking it in an ultraviolet light oven. This step is repeated a number of times, the number depending on the thickness desired. Thus, the thick films 3 are formed on the necessary portions on the substrate 1. As shown in FIGS. 8A and 8B, the thick films 3 may be formed at the whole area or partial areas between the two mounting portions 1A and between the two mounting portions 1C.

Because of the presence of the thick films 3 on the upper surface of the substrate 1, the support shaft 8A and the support pins 7A are disposed on the thick films 3 and the guide supporting member 6 is raised from the upper surface of the substrate 1 by the thickness of the thick films 3. The thickness of the thick films 3 is set sufficiently greater than the height of the burr 11 so that the support shaft 8A and the support pins 7A can move smoothly without being hindered by the burr 11. Instead of specially forming the thick films 3, the number of times of the printing steps for the under-resist, the mask resist, and the over-resist mentioned may be increased to concurrently form necessary films corresponding to the thick films 3 on the substrate 1.

Alternatively, any raised surfaces rather than the thick films 3 may be formed near the mounting portions 1A and 1C by lightly pressing the substrate 1 from the lower surface thereof. In this manner, substantially the same effect as that of the thick films 3 can be obtained.

The operation of the key switch device having the above construction will now be described with reference to FIG. 7, a vertical sectional view of the key switch device. When the key top 5 is depressed, the support shaft 7B of the first link member 7 is rotated counterclockwise in the arcuate recesses 5C of the connecting portions 5A of the key top 5 and, simultaneously, the support pins 8B of the second link member 8 are slid horizontally (rightward as viewed in FIG. 7) in the elongated recesses 5D of the connecting portions 5B of the key top 5. At the same time, the support shaft 8A of the second link member 8 is rotated clockwise in the arcuate recesses 1D of the mounting portions 1A of the substrate 1 and, simultaneously, the support pins 7A of the first link member 7 are slid horizontally (rightward as viewed in FIG. 7) in the elongated recesses 1E of the mounting portions 1C of the substrate 1.

As a result, the fulcrum portion 6A mutually rotatably supporting the first and second link members 7,8 is lowered to gradually depress the rubber spring 4. When the amount of depression of the rubber spring 4 exceeds a certain limit, the rubber spring 4 buckles. Accordingly, the fixed contact pattern 2 on the substrate 1 is short-circuited by the movable contact provided in the rubber spring 4, thus effecting a switching operation.

When the depression force applied to the key top 5 is removed, the fulcrum portion 6A of the first and second link members 7,8 is lifted by an elastic restoring force of the rubber spring 4. In association therewith, the support shafts 7B,8A and the support pins 7A,8B are operated reversely to the above. As a result, the key top 5 is returned to the original position.

In the above operation, the support shafts 7B,8A are only rotated in the respective arcuate recesses 5C,1D without horizontal movement. Therefore, the key top 5 is prevented from being horizontally moved, so that there is no possibility of the key top 5 contacting adjacent keys. The key top 5 is moved vertically with its horizontal condition being maintained.

The rubber spring 4 is substantially trapezoidal as viewed in side elevation, and an angle of inclination of the oblique sides depending upon the lengths of the parallel bases and the height of the trapezoid is decided according to the desired key touch. Further, the height of the trapezoid, i.e., the height of the rubber spring 4, is decided according to the key stroke, and the height is preferably set large. However, in consideration of the thickness of the key switch device as a whole, it is apparent that the size of the rubber spring 4 cannot be greatly increased.

Since the side plates 71,81 of the first and second link members 7,8 are reduced in width at the end portions as viewed in side elevation, the key stroke operation is not hindered during the vertical movement of the key top 5 and a sufficient key stroke can be ensured.

According to the key switch device of the invention, the complex construction, including the circuit board, the holder member, and the switch supporting plate found in the prior art can be simplified. Accordingly, the use of the key switch device according to the invention makes it possible to make a thinner keyboard and to increase the key stroke improving key to obtain reliable key entry. Furthermore, it is greatly advantageous in reduction in the number of parts, the ease in assembly, and the reduction in weight.

In most cases, a logic board, a memory device and a power supply in a portable computer are generally located under a keyboard and any measures taken against the heat generated from these elements must be taken into consideration. According to the key switch device of the invention, the substrate is provided with a plurality of holes (the blanked holes 1B). Since these holes function as cooling holes, effective heat radiation can be carried out. So from this point of view as well, the structure of the key switch device of the invention is improved.

In addition, the key switch device in the preferred embodiment can eliminate the need of guiding a key stem through a key holder portion. Accordingly, there is no possibility that a sliding noise may be generated between the key stem and the key holder portion upon depression of the key top as in the prior art key switch device. Further, there is no need to reduce the operational area of the key top and/or for depressing a central portion of the key top.

In the key switch device in the preferred embodiment, the support shaft 7B, engaged with the arcuate recesses 5C of the connecting portions 5A, and the support shaft 8A, engaged with the arcuate recesses 1D of the mounting portions 1A, are inhibited from horizontally moving but permitted only to rotate in the respective arcuate recesses 5C,1D upon depression of the key top 5. Accordingly, the key top 5 is prevented from moving horizontally to come into contact with any adjacent keys. Because of this, the structure of the key switch device is advantageous in that it provides good key operability and reliable key entry.

Further, since the substrate 1 is formed of a metal such as aluminum or iron, it can effectively shield any noise generated from circuits located under the substrate 1.

It is to be noted that the invention is not limited to the above preferred embodiment but various modifications and changes may be made without departing from the scope of the invention.

For example, the link members 7,8 in the preferred embodiment may be formed as the same kind of members combined in a pantograph configuration.

Further, while the rubber spring 4 is depressed by the fulcrum portion 6A of the link members 7,8 in the preferred embodiment, the rubber spring 4 may be depressed by another member provided on the link members 7,8 or on the key top 5.

Further, the substrate may be formed of a resin having some rigidity by injection molding or the like. In this case, the under-resist printing step (i.e., the step of forming an insulating layer on the substrate), the blanking step, and the bending step mentioned above are not necessary. In this case, with resin, the pad means may be integrally formed during the molding process.

What is claimed is:

1. A key switch device, comprising:

a substrate formed of a plastically deformable material;

a circuit pattern printed on an insulated upper surface of said substrate so as to form a unitary structure with said substrate, said circuit pattern including a fixed contact pattern having at least a pair of fixed contacts formed in said circuit pattern;

a key top provided in relationship corresponding to each said fixed pair of contacts;

a guide supporting member connected to a lower portion of said key top for supporting said key top and guiding vertical movement of said key top;

a movable contact for performing a switching operation between said fixed contacts in association with said vertical movement of said key top; and a mounting portion formed in said substrate for mounting said guide supporting member.

2. The key switch device as defined in claim 1, wherein:

said key top has a connecting portion adapted to be connected to said guide supporting member, said connecting portion projecting from a lower surface of said key top at a position corresponding to said mounting portion of said substrate;

said guide supporting member comprising two link members intersecting each other and mutually rotatably connected at a point of intersection, each of said two link members having support pins extending from at least one end of at least one of said two link members;

said mounting portion of said substrate comprising a first group of mounting members located on one side with respect to a vertical line passing the point of intersection and a second group of mounting members located on the other side with respect to the vertical line, at least one of said first group and said second group comprising elongated linear mounting portions for slidably receiving said support pins; and said connecting portion of said key top comprises a first group of mounting members located on one side with respect to the vertical line and a second group of mounting members located on the other side with respect to the vertical line.

3. The key switch device as defined in claim 1, wherein said mounting portion is formed by pressing said substrate from a lower surface thereof and a raised surface is formed on said upper surface of said substrate at a portion with which said support pins of said guide supporting member are in contact.

4. A key switch device, comprising:

a key having a top and a back surface;

a guide supporting member;

engaging means on the back surface of said key for attaching said guide supporting member to said key;

a substrate formed of a deformable material having a fixed contact pattern printed on an insulated upper surface of said substrate to form a unitary structure;

mounting means formed in said substrate for attaching said guide supporting member to said substrate; and a movable contact for performing a switching operation with said fixed contact pattern.

5. The key switch device as claimed in claim 4, wherein said mounting means has four elements so positioned to define corners of a rectangle having said fixed contact pattern contained therein.

6. The key switch device as claimed in claim 5, said movable contact comprises:

a spring element; and an electrical contact mounted to said spring element, wherein said spring element is mounted on said substrate between said four elements and below a center portion of said guide supporting member.

7. The key switch device as claimed in claim 5, wherein said substrate is a metallic sheet and said mounting means are punch formed.

8. The key switch device as claimed in claim 5, further comprising pad means positioned between each of a first pair of said four elements and a second pair of said four elements for facilitating unimpeded movement of said guide supporting member.

9. The key switch device as claimed in claim 8, wherein said pad means are raised portions of said substrate.

10. The key switch device as claimed in claim 8, wherein said pad means are insulating thick films adhered to said substrate.

11. The key switch device as claimed in claim 8, wherein each pad means between a pair of said four elements comprises two pads, one of said two pads immediately adjacent each element of said pair of elements.

12. The key switch device as claimed in claim 5, wherein said substrate is a plastic formed with said mounting means.

13. The key switch device as claimed in claim 12, further comprising pad means positioned between each of a first pair of said four elements and a second pair of said four elements for facilitating unimpeded movement of said guide supporting member.

14. The key switch device as claimed in claim 13, wherein said pad means are raised portions of said substrate.

15. The key switch device as claimed in claim 13, wherein said pad means are insulating thick films adhered to said substrate.

16. The key switch device as claimed in claim 13, wherein each pad means between a pair of said four elements comprises two pads, one of said two pads immediately adjacent each element of said pair of elements.

17. A method for producing a key switch, comprising the steps of:

forming a substrate having means for mounting a key supporting member;

molding components of the key supporting member and a key top;

applying a fixed contact pattern to the substrate to form a unitary structure;

mounting a support element of a movable contact onto the unitary structure;

assembling the components of the key supporting member;

attaching the key supporting member to the means formed in the substrate for mounting the key supporting member; and attaching the key top to the key supporting member.

18. The method as claimed in claim 17, further comprising the step of creating raised pad portions on the substrate to provide a sliding surface for the key supporting member.

19. The method as claimed in claim 18, wherein the forming step for the substrate and the creating step are a step of molding the substrate of a resin having molded therewith the means for mounting the key supporting member and the raised pad portions.

20. The method as claimed in claim 18, wherein the substrate is formed of metal and the step of forming the substrate comprises the steps of:

punching out portions of the substrate to define the means for mounting the key supporting member; and forming the means for mounting the key supporting member.

21. The method as claimed in claim 20, further comprising the step of applying an insulating layer to the substrate prior to applying the fixed contact pattern to produce the unitary structure, wherein said step of creating raised pad portions is by coating a material having a low coefficient of friction on the substrate.

* * * * *